United States Patent
Hwu et al.

(10) Patent No.: US 11,563,009 B2
(45) Date of Patent: *Jan. 24, 2023

(54) SEMICONDUCTOR MEMORY DEVICE

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Jenn-Gwo Hwu, Taipei (TW); Samuel C. Pan, Hsinchu (TW); Chien-Shun Liao, Hsinchu (TW); Kuan-Hao Tseng, Kaohsiung (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/135,783

(22) Filed: Dec. 28, 2020

(65) Prior Publication Data

US 2021/0193667 A1 Jun. 24, 2021

Related U.S. Application Data

(60) Continuation of application No. 16/538,747, filed on Aug. 12, 2019, now Pat. No. 10,879,249, which is a
(Continued)

(51) Int. Cl.
*H01L 27/108* (2006.01)
*H01L 29/94* (2006.01)

(52) U.S. Cl.
CPC .. *H01L 27/10829* (2013.01); *H01L 27/10832* (2013.01); *H01L 27/10847* (2013.01);
(Continued)

(58) Field of Classification Search
CPC ......... H01L 27/10829; H01L 27/10832; H01L 27/10861; H01L 27/10855; H01L 29/945; H01L 27/10847
See application file for complete search history.

(56) References Cited

U.S. PATENT DOCUMENTS 5,214,304 A 5/1993 Ema et al.
5,237,528 A 8/1993 Sunami et al.
(Continued)

OTHER PUBLICATIONS

Non-Final Office Action issued in related U.S. Appl. No. 15/719,101, dated Jan. 24, 2019.
(Continued)

*Primary Examiner* — Julia Slutsker
(74) *Attorney, Agent, or Firm* — McDermott Will & Emery LLP

(57) ABSTRACT

A semiconductor memory device includes a transistor having a gate, a source and a drain and a metal-insulator-semiconductor (MIS) structure. The transistor and the MIS structure are disposed on a common substrate. The MIS structure includes a dielectric layer disposed on a semiconductor region, and an electrode electrically disposed on the dielectric layer and coupled to the drain of the transistor. The electrode includes a bulk portion and a high-resistance portion, both disposed on the dielectric layer. The high-resistance portion has a resistance value in a range from $1.0 \times 10^{-4}$ Ωcm to $1.0 \times 10^{4}$ Ωcm or a sheet resistance in a range from $1.0 \times 10^{2}$ Ω/□ to $1.0 \times 10^{10}$ Ω/□.

20 Claims, 19 Drawing Sheets

Related U.S. Application Data division of application No. 15/719,101, filed on Sep. 28, 2017, now Pat. No. 10,381,353.

(60) Provisional application No. 62/489,040, filed on Apr. 24, 2017.

(52) U.S. Cl.
CPC .. *H01L 27/10855* (2013.01); *H01L 27/10861* (2013.01); *H01L 29/945* (2013.01)

(56) References Cited

U.S. PATENT DOCUMENTS

| | | | |
|---|---|---|---|
| 2003/0045068 A1 | 3/2003 | Gutsche et al. | |
| 2005/0189609 A1 | 9/2005 | Tu | |
| 2015/0061075 A1* | 3/2015 | Yeh | H01L 29/945 |
| | | | 257/532 |

OTHER PUBLICATIONS

Notice of Allowance issued in related U.S. Appl. No. 15/719,101, dated May 21, 2019.
Non-Final Office Action issued in U.S. Appl. No. 16/538,747, dated May 14, 2020.
Notice of Allowance issued in U.S. Appl. No. 16/538,747, dated Oct. 16, 2020.

* cited by examiner

SEMICONDUCTOR MEMORY DEVICE

RELATED APPLICATIONS

This application is a continuation application of U.S. application Ser. No. 16/538,747 filed on Aug. 12, 2019, which claims the benefit of priority of U.S. application Ser. No. 15/719,101 filed on Sep. 28, 2017, which claims the benefit of priority of U.S. Provisional Application No. 62/489,040 filed on Apr. 24, 2017, the entire contents of both applications are incorporated herein by reference.

TECHNICAL FIELD

The disclosure relates to method of manufacturing semiconductor integrated circuits, and more particularly to semiconductor memory cells.

BACKGROUND

A dynamic access memory (DRAM) is one of the important semiconductor devices in the semiconductor industry. As the dimensions of the DRAM cell decreases, metal resistivity of a memory cell capacitor increases, and leakage also drastically increases. Increased storage capacity of DRAM cell capacitors is continually required large while the dimensions of the cell area shrink. The scaling down problem of the metal and the oxide is becoming a serious obstacle to higher device density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in/between the described operations, and the order of operations may be changed.

In some embodiments, a semiconductor device includes a volatile memory cell, such as a dynamic random access memory (DRAM) cell having a metal-insulator-semiconductor (MIS) structure (e.g., MIS tunnel diode). More specifically, the memory cell includes a metal electrode having a high sheet resistance portion and a MIS tunnel diode to enhance a transient read current for a DRAM application. The high sheet resistance portion has a relatively thinner metal thickness than the other portion of the metal electrode. Since the resistance of a thin metal layer cannot be ignored, a voltage applied to the metal electrode would drop across the metal layer. The voltage drop causes more carriers to be stored in the substrate under the thin metal layer than in the substrate under the thick metal layer. The two-state current window is therefore enhanced compared to that of a storage device with a uniform metal thickness.

Figure 1A:
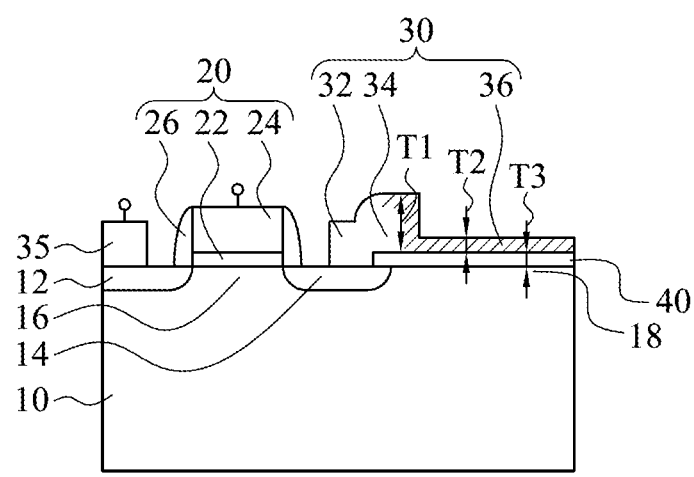
FIG. 1A is a cross sectional view of a memory cell in accordance with embodiments of the present disclosure.
Figure 1B:
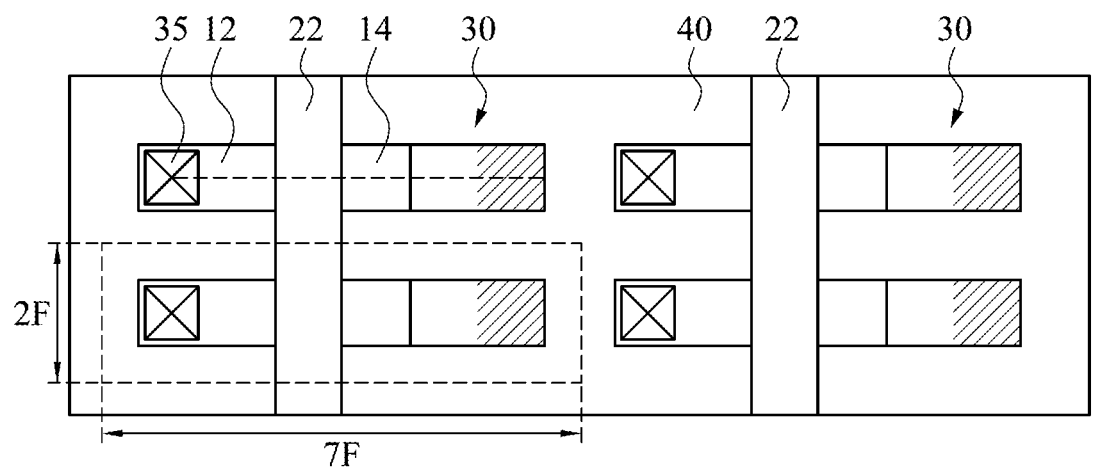
FIG. 1B is a plan views of memory cells.
Figure 1C:
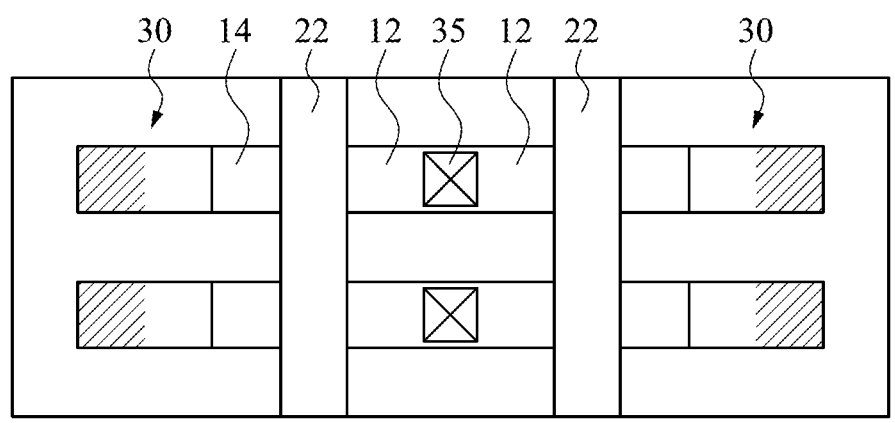
FIG. 1C is a plan views of memory cells.
Figure 1D:
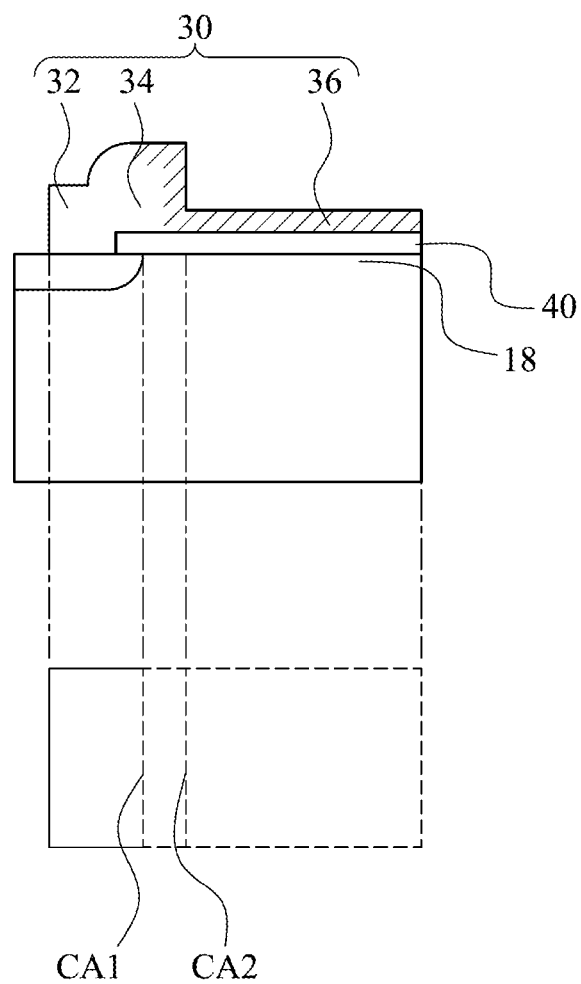
FIG. 1D shows an enlarged cross sectional view and plan view of the cell capacitor area in accordance with embodiments of the present disclosure.

FIG. 1A is a cross sectional view of a memory cell in accordance with embodiments of the present disclosure. FIGS. 1B and 1C are plan views of memory cells and FIG. 1D shows an enlarged cross sectional view and plan view of the cell capacitor area in accordance with embodiments of the present disclosure. The cross sectional view of FIG. 1A corresponds to line A-A' of FIG. 1B.

As shown in FIGS. 1A-1D, a memory cell includes an access transistor (e.g., a metal-oxide-semiconductor field effect transistor (MOSFET)) and a MIS structure. The access transistor includes a gate structure 20, a source 12 and a drain 14 formed over a substrate 10. In the present disclosure, a source and a drain are interchangeably referred to. The gate structure 20 includes a gate dielectric layer 22 formed on a channel 16 of the substrate, a gate electrode 24 and sidewall spacers 26. The MIS structure includes a metal electrode 30, a capacitor dielectric layer 40 and a carrier accumulation region 18 of the substrate 10. The metal electrode 30 includes a drain contact portion 32, a thick (or bulk) portion 34 and a thin portion 36, as shown in FIG. 1A. The memory cell further includes a source contact portion 35. The memory cell size is $14F^2$, where F is the minimum line width defined by the design rule, in some embodiments.

In some embodiments, the substrate 10 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. The substrate 10 includes isolation regions in some embodiments, such as shallow trench isolation (STI), defining active regions and separating one or more electronic elements from other electronic elements.

In some embodiments, the gate dielectric layer 22 is made of $SiO_2$ formed by thermal oxidation, chemical vapor deposition (CVD) or atomic layer deposition (ALD). In other embodiments, the gate dielectric layer 22 includes one or more high-k dielectric layers having a dielectric constant greater than that of $SiO_2$. For example, the gate dielectric layer 22 may include one or more layers of a metal oxide or a silicate of Hf, Al, Zr, combinations thereof, and multilayers thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_3$, $Y_2O_3$, $HfO_2$, $ZrO_2$, HfSiON, $YGe_xO_y$, $YSi_xO_y$ and $LaAlO_3$, and the like. In some embodiments, the gate dielectric layer 22 has a thickness in a range from about 1 nm to about 10 nm.

The gate electrode layer 24 is made of one or more layers made of conductive material. The conductive material includes doped-polysilicon, doped-amorphous silicon or any other suitable semiconductor materials, in some embodiments. In other embodiments, the gate electrode layer 24 includes one or more metal-based conductive materials selected from the group consisting of W, Cu, Ti, Ag, Al, TiAl, TiAlN, TaC, TaCN, TaSiN, Mn, Co, Pd, Ni, Re, Ir, Ru, Pt, and Zr. In some embodiments, the gate electrode layer 24 includes a conductive material selected from the group consisting of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. In some embodiments, the gate electrode layer 24 includes one or more work function adjustment layers disposed on the gate dielectric layer 22. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi TiSi and TaSi is used as the work function adjustment layer, and for the p-channel FinFET, one or more of TiAlC, Al, TiAl, TaN, TaAlC, TiN, TiC and Co is used as the work function adjustment layer. The thickness of the gate electrode layer is in a range from about 10 nm to about 200 nm in some embodiments.

The sidewall spacers 26 include one or more layers of $SiO_2$, SiN, SiON, SiOCN or other suitable dielectric materials. The thickness of the sidewall spacers is in a range from about 5 nm to about 50 nm in some embodiments.

The metal electrode 30 is made of one or more layers made of conductive material. The conductive material for the metal electrode 30 includes Al, Cu, Ni, W, Ti, Pt, TaN, TiN and/or doped polysilicon. The source contact portion 35 is made of similar material, and is made of the same material as the metal electrode 30 in some embodiments. The drain contact portion 32 may be made of the same material as or a different material from the thick and thin portions in some embodiments. The thin portion 36 may be made of the same material as or a different material from the thick portion 34 in some embodiments.

The thickness T1 of the thick portion 34 of the metal electrode 30 is in a range from about 5 nm to about 100 nm in some embodiments, and the thickness T2 of the thin portion 36 of the metal electrode 30 is in a range from about 1 nm to about 10 nm in some embodiments. The material and the thicknesses T1, T2 of the metal electrode can be set so that the thin portion 36 has a resistance value in a range from about $1.0 \times 10^{-4}$ Ωcm to about $1.0 \times 10^4$ Ωcm or a sheet resistance in a range from about $1.0 \times 10^2$ Ω/□ to about $1.0 \times 10^{10}$ Ω/□. The resistance value of the thick portion 34 is in a range from about $1.0 \times 10^{-6}$ Ωcm to about $1.0 \times 10^{-5}$ Ωcm, or a sheet resistance of the thick portion 34 is in a range from about 1.0 Ω/□ to about 10.0 Ω/□. In certain embodiments, the thickness T2 of the thin portion 36 is about ½ to about 1/10 of the thickness of the thick portion 34. In certain embodiments, the resistance value or the sheet resistance of the thin portion 36 is about $10^2$ times to about $10^6$ times those of the thick portion 34.

The capacitor dielectric layer 40 includes one or more layers of $SiO_2$, $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_3$, $Y_2O_3$, $HfO_2$, $ZrO_2$, HfSiON, $YGe_xO_y$, $YSi_xO_y$ and $LaAlO_3$, and any other suitable dielectric material. The thickness T3 of the capacitor dielectric layer 40 is in a range from about 0.5 nm to about 5 nm in some embodiments and is in a range from about 1 nm to about 3 nm in other embodiments. The thickness of the capacitor dielectric layer 40 is sufficiently thin so that carrier tunneling occurs when a voltage (e.g., about 1 mV to about 10 V in absolute value) is applied. The capacitor dielectric layer 40 is partially disposed over the drain region 14 in some embodiments, and is not disposed over the drain region 14 in other embodiments. The capacitor dielectric layer 40 is made of the same material as or a different material than the gate dielectric layer 22.

As shown in FIGS. 1B and 1D, the MIS structure constitute the metal electrode portion (the thick portion 34 and the thin portion 36), the capacitor dielectric layer 40 and a carrier accumulation region 18 of the substrate. The effective capacitor area CA1 is defined by the overlapped portion of the metal electrode portion, the capacitor dielectric layer 40 and a carrier accumulation region 18. The area CA2 of the thin portion is smaller than the area CA1 and CA2 is in a range from about 95% to about 50% of CA1 in some embodiments. In other words, an area ratio of the thin electrode portion to the thick electrode portion of the MIS structure is in a range from about 50:50 to about 95:5. The area CA2 is in a range from about 90% to about 70% of CA1 in other embodiments. The minimum value of CA2 or CA1-CA2 is about $F^2$, where F is the minimum line width defined by the design rule.

As shown in FIGS. 1B and 1C, a plurality of memory cells are provided in some embodiments. In certain embodiments, one gate electrode as a word line is provided for two more memory cells. In FIG. 1B, the memory cells are independently provided and separated by the isolation insulating regions. In FIG. 1C, sources 12 of two memory cells are shared.

Figure 1E:
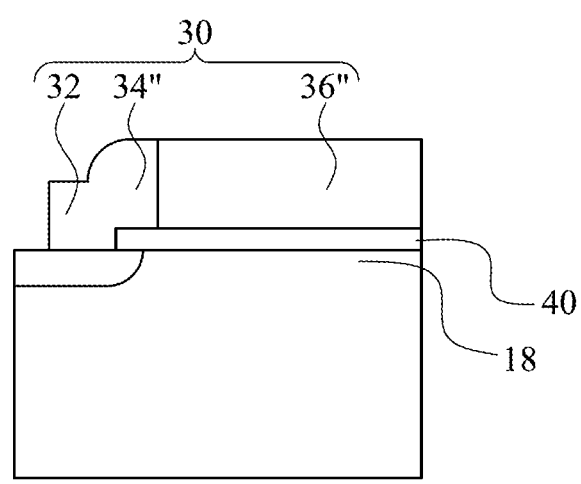
FIG. 1E is a cross sectional view of a memory cell in accordance with other embodiments of the present disclosure.

FIG. 1E is a cross sectional view of a memory cell in accordance with other embodiments of the present disclosure. In the foregoing embodiments, the electrode 30 includes a thin portion 36 as a high resistance portion. In the embodiments of FIG. 1E, a high resistance layer 36" having a higher resistance than the thick portion 34 is formed instead of the thin portion. The layer 36" has a resistance value in a range from about $1.0 \times 10^{-4}$ to about $1.0 \times 10^4$ Ωcm or a sheet resistance in a range from about $1.0 \times 10^2$ to about $1.0 \times 10^{10}$ Ω/□. In some embodiments, the layer 36" can be a non-doped or a doped semiconductor material, such as polysilicon, amorphous silicon, poly germanium and/or amorphous germanium. The thickness of the high resistance layer 36" can be smaller than, equal to or greater than the thickness of the thick portion 34. A portion of the high resistance layer 36" is disposed over the thick portion 34" in some embodiments.

Figure 2A:
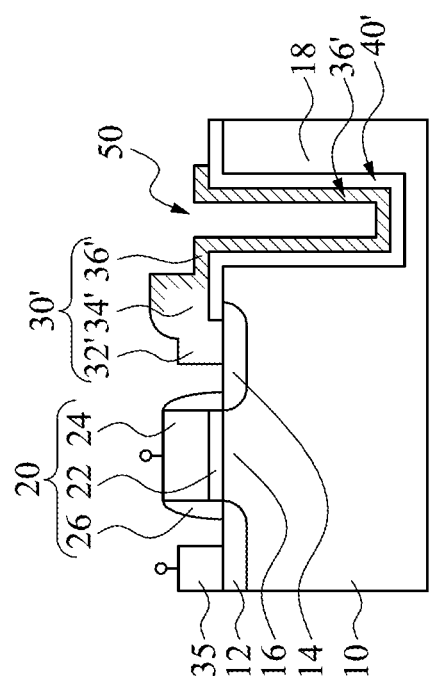
FIG. 2A is a cross sectional view of a memory cell and FIG. 2B is a plan view of DRAM cells in accordance with other embodiments of the present disclosure.
Figure 2B:
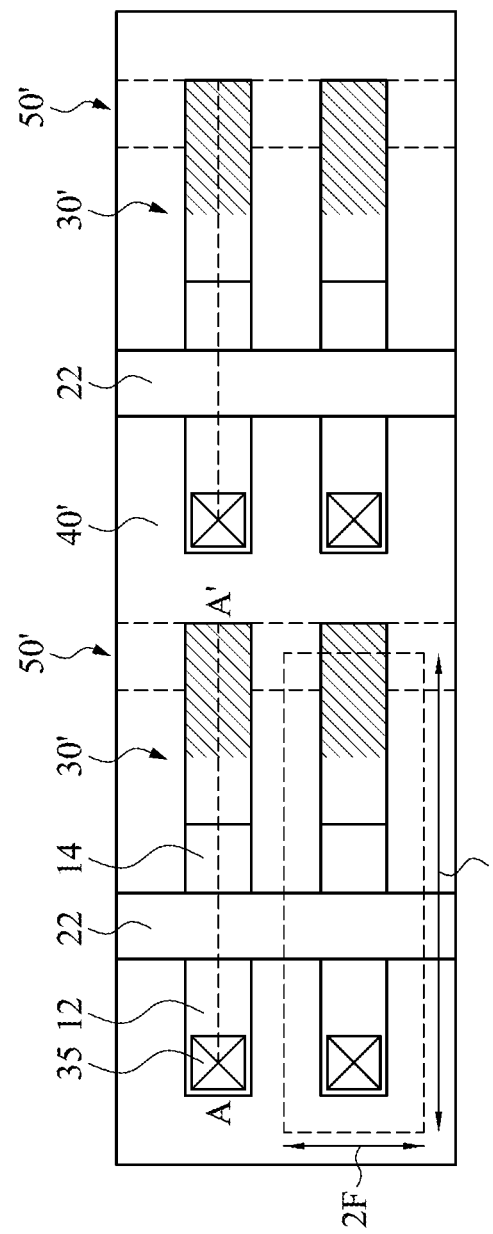

FIG. 2A is a cross sectional view of a memory cell and FIG. 2B is a plan view of DRAM cells in accordance with other embodiments of the present disclosure. The cross sectional view of FIG. 2A corresponds to line A-A' of FIG. 2B. Materials, configurations, processes and/or operations the same as or similar to those explained with respect to FIGS. 1A-1D may be applied to the following embodiments, and the detailed explanation thereof may be omitted to avoid redundancy.

In FIGS. 2A and 2B, a trench capacitor is employed as the MIS capacitor structure, whereas in FIGS. 1A-1D a planar type capacitor is employed.

As shown in FIGS. 2A and 2B, a memory cell includes an access transistor and a MIS structure. The access transistor includes a gate structure 20, a source 12 and a drain 14 formed over a substrate 10. The gate structure 20 includes a gate dielectric layer 22 formed on a channel 16 of the substrate, a gate electrode 24 and sidewall spacers 26. The MIS structure includes a metal electrode 30', a capacitor dielectric layer 40' and a carrier accumulation region 18 formed in a trench 50 provided in the substrate 10. The metal electrode 30' includes a drain contact portion 32', a thick portion 34' and a thin portion 36', as shown in FIG. 2A. The memory cell further includes a source contact portion 35. The memory cell size is $16F^2$, where F is the minimum line width defined by the design rule, in some embodiments.

When the thin portion 36' is made of a high resistance layer 36" similar to FIG. 1E, the high resistance layer 36" fully fills the trench 50 in some embodiments.

Figure 3A:
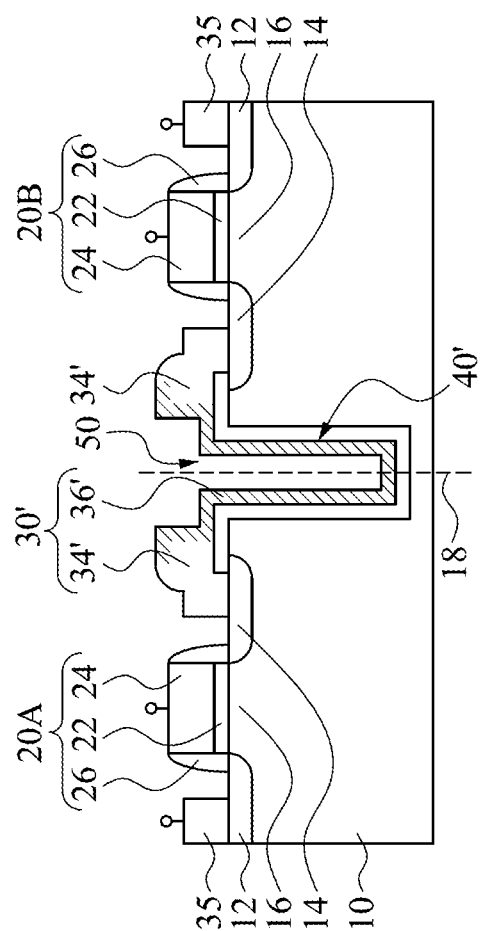
FIG. 3A is a cross sectional view of a memory cell and FIG. 3B is a plan view of DRAM cells in accordance with other embodiments of the present disclosure.
Figure 3B:
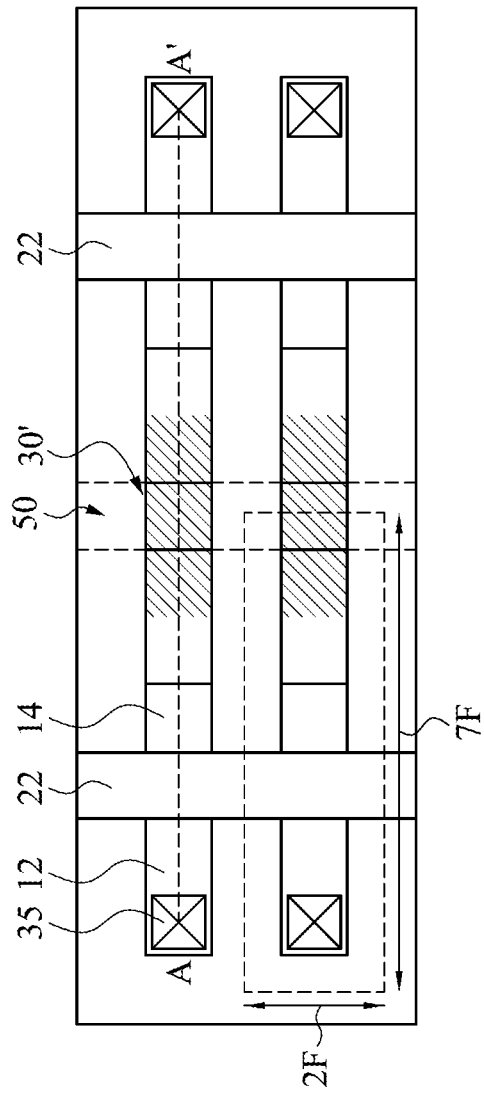

FIG. 3A is a cross sectional view of a memory cell and FIG. 3B is a plan view of DRAM cells in accordance with other embodiments of the present disclosure. The cross sectional view of FIG. 3A corresponds to line A-A' of FIG. 3B. Materials, configurations, processes and/or operations same as or similar to those explained with respect to FIGS. 1A-2B may be applied to the following embodiments, and the detailed explanation thereof may be omitted to avoid redundancy.

In FIGS. 3A and 3B, a trench capacitor is employed as the MIS capacitor structure, whereas in FIGS. 1A-1D, a planar type capacitor is employed.

As shown in FIGS. 3A and 3B, a memory cell includes an access transistor and a MIS structure. Two memory cells share the trench structure. The access transistors include gate structures 20A and 20B, each including a source 12 and a drain 14 formed over a substrate 10. Each of the gate structures 20A and 20B includes a gate dielectric layer 22 formed on a channel 16 of the substrate, a gate electrode 24 and sidewall spacers 26. The MIS structure includes a metal electrode 30', a capacitor dielectric layer 40' and a carrier accumulation region 18 formed in a trench 50 provided in the substrate 10. The metal electrode 30' includes a drain contact portion 32', a thick portion 34' and a thin portion 36', as shown in FIG. 3A. The memory cell further includes a source contact portion 35. The memory cell size is 14F², where F is the minimum line width defined by the design rule, in some embodiments.

Operations of the memory cell according to the present disclosure are explained using FIGS. 4A-6B.

Figure 4C:
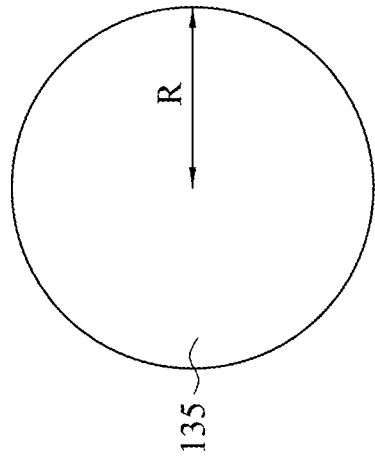
FIG. 4C is a cross sectional view of a MIS cell and FIG. 4D is a plan view of the MIS cell of a comparative example.
Figure 4D:
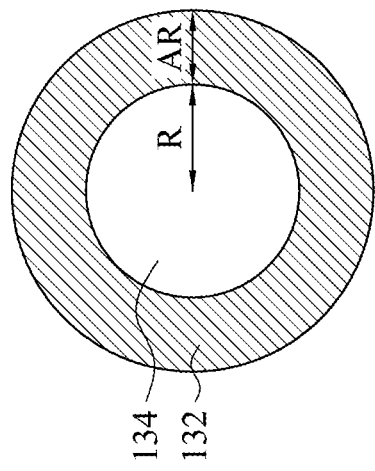
Figure 4A:
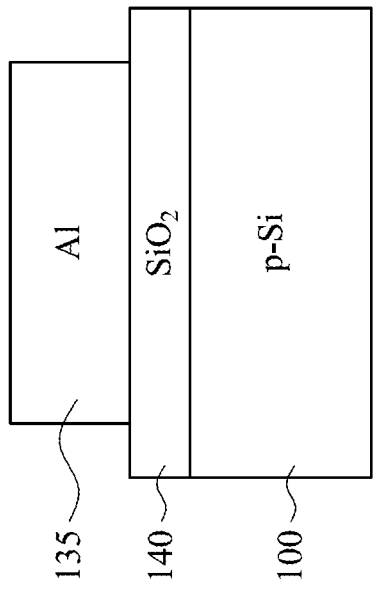
FIG. 4A is a cross sectional view of a metal-insulator-semiconductor (MIS) cell and FIG. 4B is a plan view of the MIS cell in accordance with embodiments of the present disclosure.
Figure 4B:
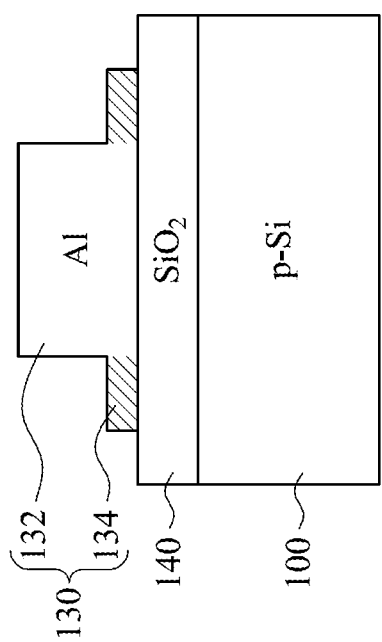

FIG. 4A is a cross sectional view of a simplified MIS cell and FIG. 4B is a plan view of the MIS cell in accordance with embodiments of the present disclosure. FIG. 4C is a cross sectional view of a MIS cell and FIG. 4D is a plan view of the MIS cell of a comparative example.

The MIS structures of FIGS. 4A-4D include a p-type Si as a semiconductor layer 100, a SiO₂ layer as an insulating (dielectric) layer 140 and an Al layer as a metal electrode layer 130 or 135. In FIGS. 4A and 4B, the metal electrode layer 130 includes a bulk portion 132 as a thick portion and an edge portion 134 as a thin portion, while in FIGS. 4C and 4D, the thickness of the metal electrode layer 135 is uniform. When a voltage is applied to the bulk portion 132, voltage drops occurs toward the circumference of the electrode 130 due to the high resistance of the edge portion 134.

Figures 5A, 5B:
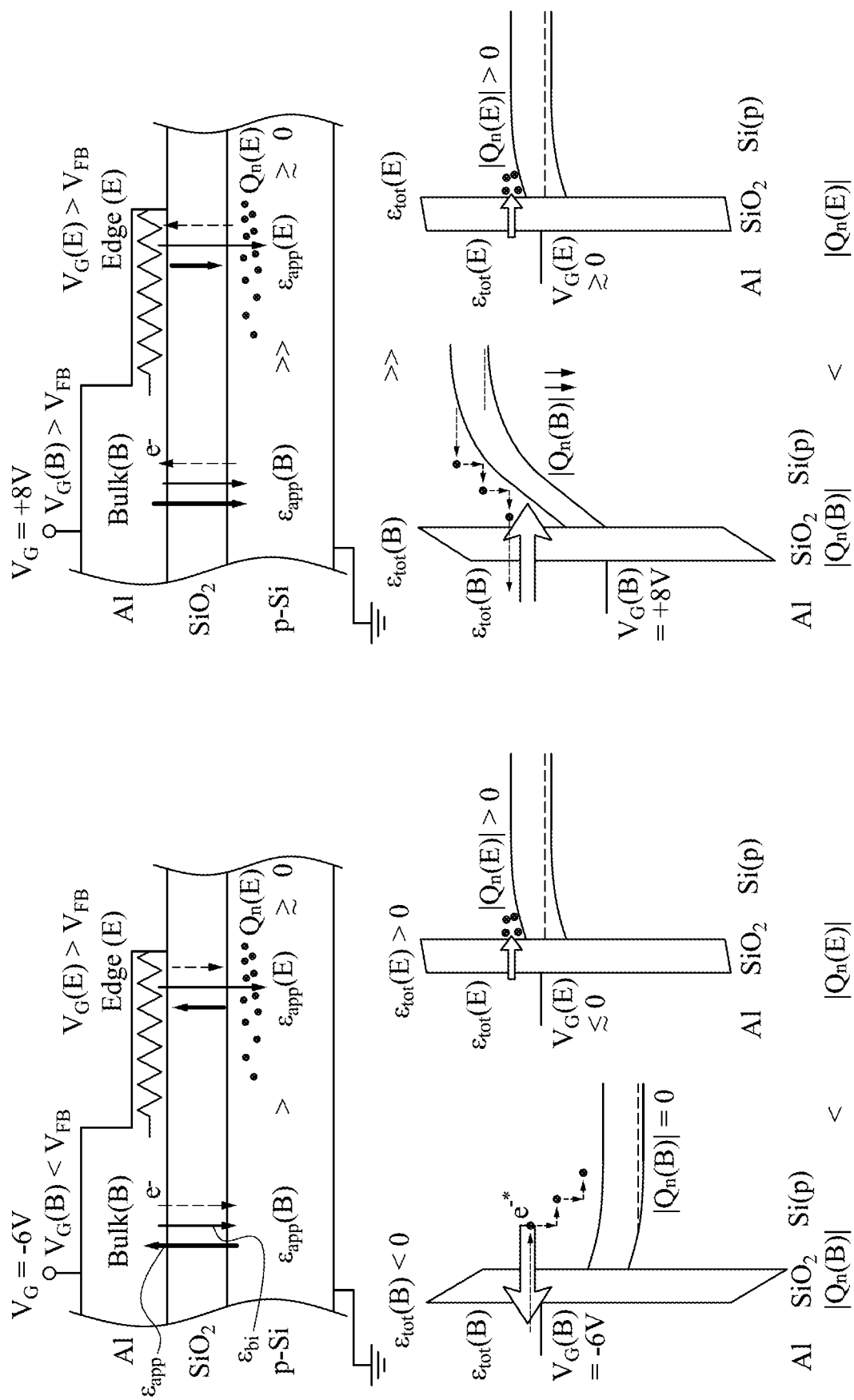
FIG. 5A shows write operations of a MIS cell in accordance with embodiments of the present disclosure.
FIG. 5B shows write operations of a MIS cell in accordance with embodiments of the present disclosure.

FIGS. 5A and 5B show write operations of the MIS memory of FIGS. 4A and 4B. In FIGS. 5A and 5B, $Q_n$ indicates electron charge amounts, $\mathcal{E}_{tot}$ indicates a total electric field, $\mathcal{E}_{bi}$ indicates a built-in field, and $\mathcal{E}_{app}$ indicates an applied electric field. FIG. 5A shows an operation to write "1" into the MIS memory. When the write voltage $V_G$, for example, -6V, is applied to the bulk portion 132 of the MIS memory, electrons tunnel through the insulating layer 140 into the semiconductor layer 100 under the bulk portion 132. In the edge portion 134, due to the voltage drop, the voltage effectively applied to the MIS structure at the edge portion is smaller than $V_G$. More specifically, $V_G(B)$ in the bulk portion is smaller than $V_{FB}$, and $V_G(E)$ in the edge portion is greater than $V_{FB}$, where $V_{FB}$ is a flat band voltage of the MIS (Al—SiO₂-p-Si) structure. Accordingly, the electric field across the MIS structure in the bulk portion is greater than that in the edge portion. Thus, additional carriers (electrons) are accumulated in the edge portion of the semiconductor layer 18, and the accumulated carriers in the edge portion represent data "1". In contrast, in the case of FIG. 4C, no additional carriers are accumulated.

FIG. 5B shows an operation to write "-1" into the MIS memory. When the write voltage $V_G$, for example, +8V, is applied to the bulk portion 135 of the MIS memory, electrons tunnel through the insulating layer 140 from the semiconductor layer 100 under the bulk portion 132. In the edge portion 134, due to the voltage drop, the voltage effectively applied to the MIS structure at the edge portion is smaller than $V_G$. More specifically, $V_G(B)$ in the bulk portion is greater than $V_{FB}$, and $V_G(E)$ in the edge portion and is also greater than $V_{FB}$. Accordingly, the electric field across the MIS structure in the bulk portion is greater than that in the edge portion with the opposite direction. Thus, additional carriers (electrons) are accumulated in the edge portion of the semiconductor layer 18, and the accumulated carriers in the edge portion represent data "-1".

Figure 6B:
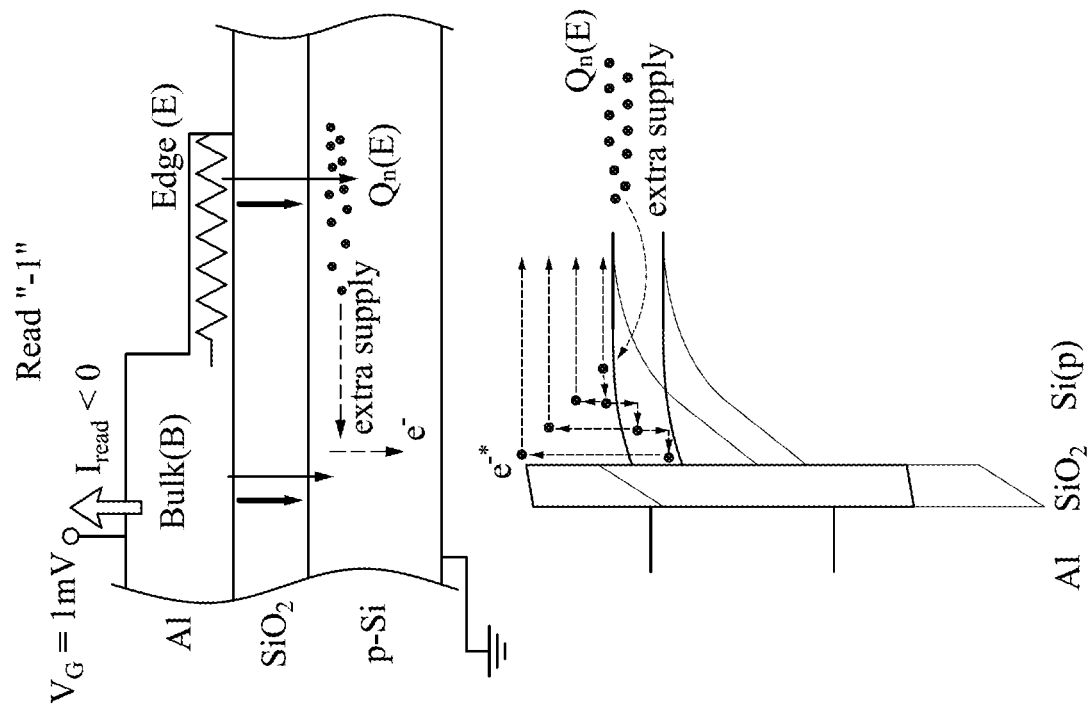
FIG. 6B shows read operations of a MIS cell in accordance with embodiments of the present disclosure.
Figure 6A:
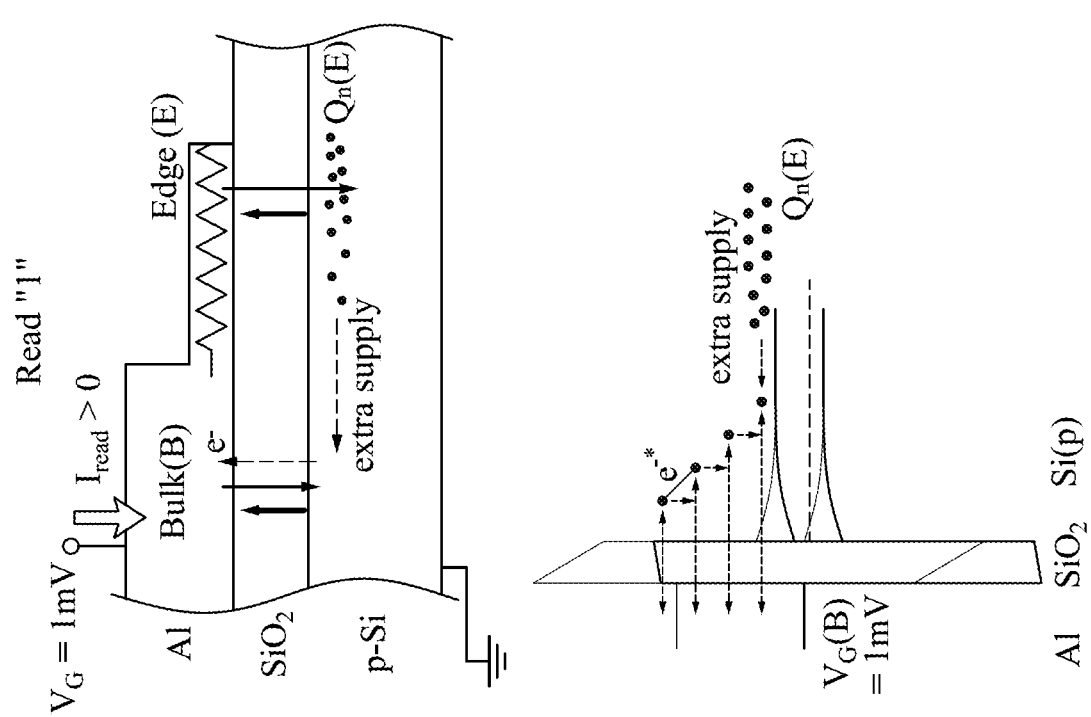
FIG. 6A shows read operations of a MIS cell in accordance with embodiments of the present disclosure.

FIGS. 6A and 6B show read operations of the MIS cell of FIGS. 4A and 4B. In FIG. 6A, the data "1" is read and in FIG. 6B, the data "-1" is read. In FIGS. 5A and 5B, $Q_n$ indicates electron charge amounts, $\mathcal{E}_{tot}$ indicates a total electric field, $\mathcal{E}_{bi}$ indicates a built-in field, $\mathcal{E}_{app}$ indicates an applied electric field, and $I_{read}$ indicates a total read current.

In FIGS. 6A and 6B, a read voltage $V_G$=1 mV is applied to the metal electrode. By applying the read voltage, a current composed of a conduction current (or a DC current) and a transient current (or an AC current) flows. The transient current is the discharging current (or reading current) after the writing processes in the MIS cell operations originated from the accumulated carriers in the edge portion. In FIG. 6A, a current flowing from the metal electrode to the semiconductor layer is observed, and in FIG. 6B, a current flowing from the semiconductor layer to the metal electrode is observed. In contrast, in the case of FIG. 4C, no transient current is observed.

Figure 7A:
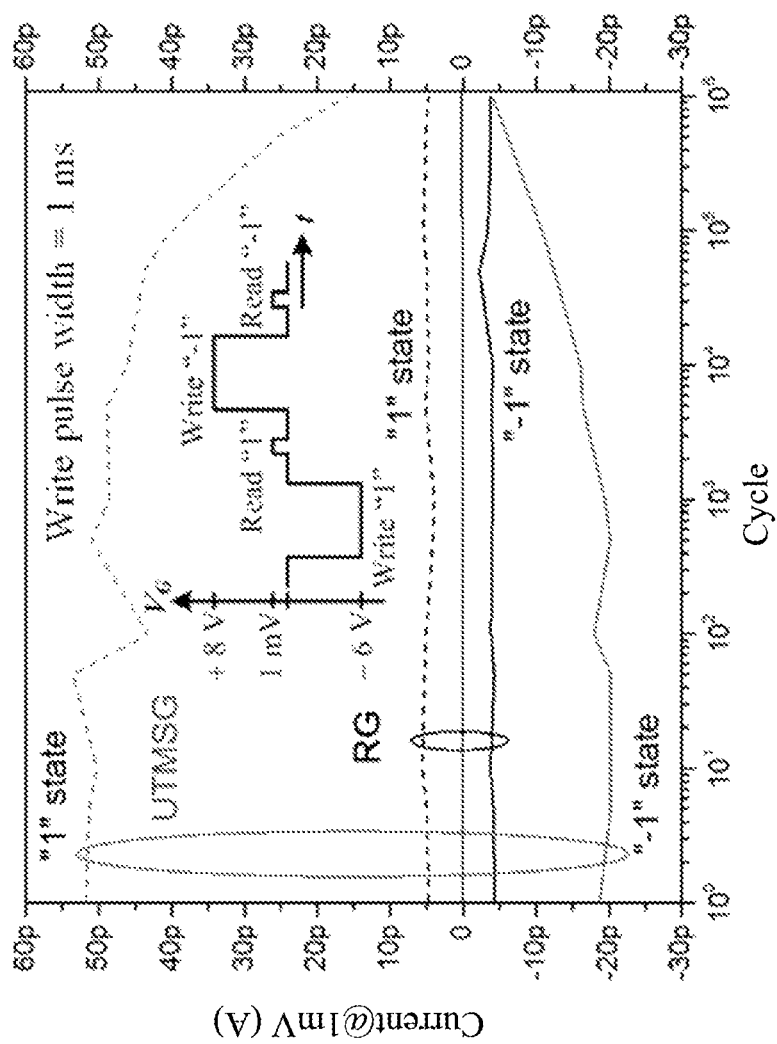
FIG. 7A shows current characteristics of a MIS cell in accordance with embodiments of the present disclosure.
Figure 7B:
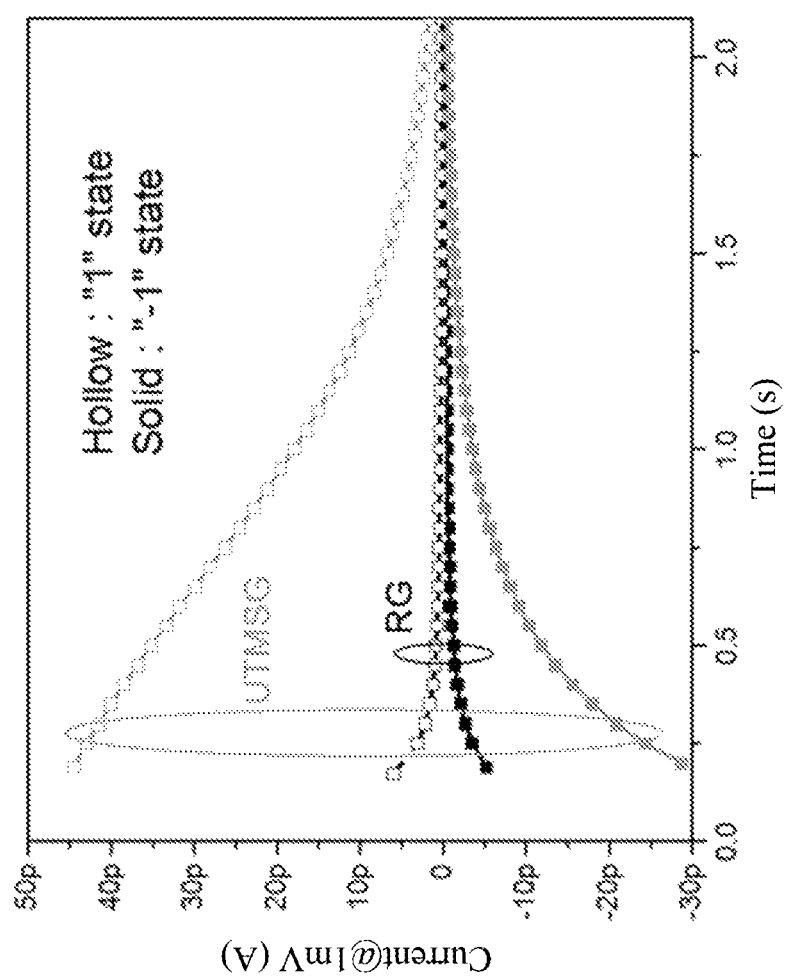
FIG. 7B shows current characteristics of a MIS cell in accordance with embodiments of the present disclosure.

FIGS. 7A and 7B show current characteristics of the MIS cells of FIGS. 4A and 4C. In FIGS. 7A and 7B, the MIS structures of FIGS. 4A and 4C are employed, where the radius R is 152.5 µm for FIG. 4A and R is 122.5 µm and ΔR is 30 µm for FIG. 4C. The thickness of the insulating layer is 3 nm.

In FIG. 7A, cyclic pulses of a write voltage for data "1" (-6 V), a read voltage (1 mV) and a write voltage for data "-1" (+8 V) are applied to the MIS cell of FIGS. 4A and 4C. In the case of the MIS cell of FIG. 4A (marked as "UTMSG" (ultra-thin metal surrounded gate)), currents in amounts of about -20 pA and about 50 pA are observed until the total number of cycles reaches about 10⁴ cycles. In the case of the MIS cell of FIG. 4C (marked as "RG" (regular gate)), only small currents in amounts of about -5 pA and about 5 pA are observed.

In FIG. 7B, current characteristics after the read voltage is applied are shown. In the case of the MIS cell of FIG. 4A, a transient current can be observed for more than about 0.5 second after the read voltage is applied, while in the case of the MIS cell of FIG. 4C, a transient current disappears about 0.5 second after the read voltage is applied.

The characteristics shown in FIGS. 7A and 7B show that the MIS cell of FIG. 4A can be applied to a DRAM memory. As set forth above, after a positive/negative write voltage is applied, carriers (e.g., electrons) are stored in the MIS structure. The voltage (electric field) across the insulating layer decreases along the thin metal portion away from the thick metal portion, due to the high resistivity of the thin metal portion. The higher voltage applied at the thick metal portion results in leakage (tunneling) of the carriers (electrons), and therefore the amount of electrons stored in the thick metal portion is lower than that in the thin metal portion.

During the reading process, the stored carriers (electrons) flow out of the MIS capacitor, i.e., discharging. The extra carriers (electrons) stored in the thin metal portion can be supplied as an additional discharging current. Therefore, a difference in the two amounts of the discharging currents (for "1" and "-1") of the MIS structure of FIG. 4A is larger than that of the MIS structure of FIG. 4C.

FIGS. 8A-8H show various stages of a manufacturing process of the memory cell of FIG. 1A in accordance with the present disclosure. It is understood that additional operations can be provided before, during, and after processes shown by FIGS. 8A-8H, and some of the operations described below can be replaced or eliminated, for additional embodiments of the method. The order of the operations/processes may be interchangeable.

Figure 8A:
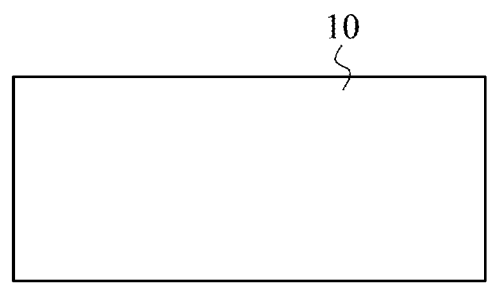
FIG. 8A shows a stage of a manufacturing process of a memory cell in accordance with the present disclosure.
Figure 8B:
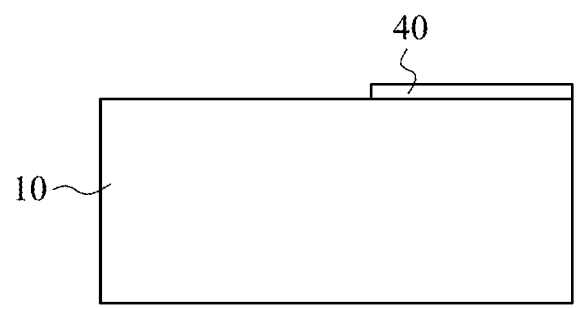
FIG. 8B shows a stage of a manufacturing process of a memory cell in accordance with the present disclosure.

In FIG. 8A, a substrate 10 is provided. Then, a capacitor dielectric layer 40 is formed as shown in FIG. 8B. The capacitor dielectric layer 40 can be formed by CVD, physical vapor deposition (PVD) and/or ALD. Further, by using lithography and etching operations, unnecessary portions of the deposited layer are removed.

Figure 8C:
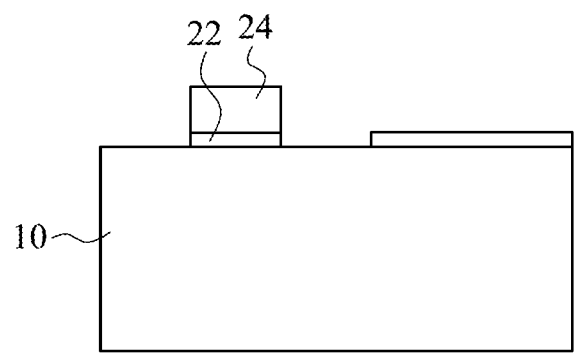
FIG. 8C shows a stage of a manufacturing process of a memory cell in accordance with the present disclosure.
Figure 8D:
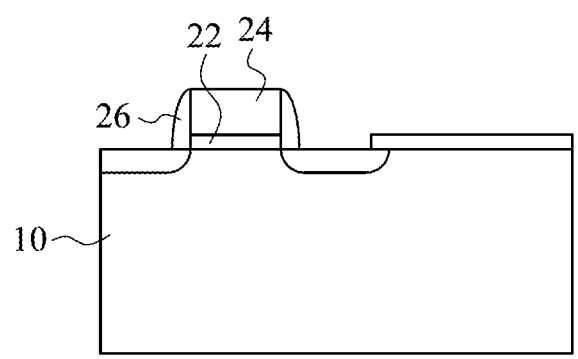
FIG. 8D shows a stage of a manufacturing process of a memory cell in accordance with the present disclosure.

Then, as shown in FIG. 8C, a gate dielectric layer 22 and a gate electrode layer 24 are formed. The gate dielectric layer 22 can be formed by thermal oxidation, CVD, PVD and/or ALD. The gate electrode layer 24 can be formed by CVD, PVD, ALD and/or electro plating or any other suitable film forming methods. Further, by using lithography and etching operations, unnecessary portions of the deposited layers are removed. Further, as shown in FIG. 8D, sidewall spacers 26 are formed. The sidewall spacers 26 can be formed by depositing an insulating layer by CVD, PVD and/or ALD, followed by anisotropic etching.

Figure 8E:
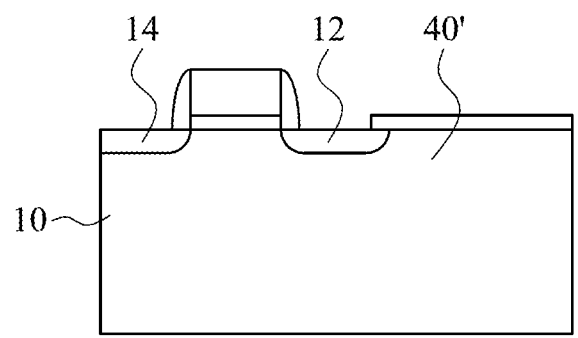
FIG. 8E shows a stage of a manufacturing process of a memory cell in accordance with the present disclosure.

Then, as shown in FIG. 8E, source 12 and drain 14 are formed by introducing impurities in both side regions of the gate structure in the substrate 10. The impurities, such as As, P, In, B and/or $BF_2$, are introduced by one or more ion implantation processes. The capacitor dielectric layer 40 may be formed after the source and drain are formed.

Figure 8F:
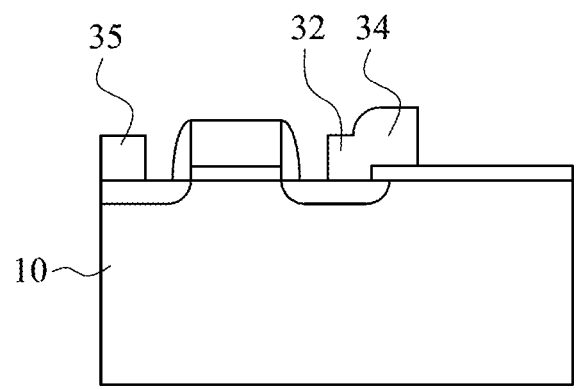
FIG. 8F shows a stage of a manufacturing process of a memory cell in accordance with the present disclosure.

Subsequently, conductive layers of a source contact portion 35 and a drain contact portion 32 and a thick portion 34 of the metal electrode (see, FIG. 1A) are formed, as shown in FIG. 8F. The conductive layers are formed by CVD, PVD, ALD and/or electro plating and lithograph and etching operations are performed to define the source contact portion 35 and the drain contact portion 32 and the thick portion 34.

Figure 8G:
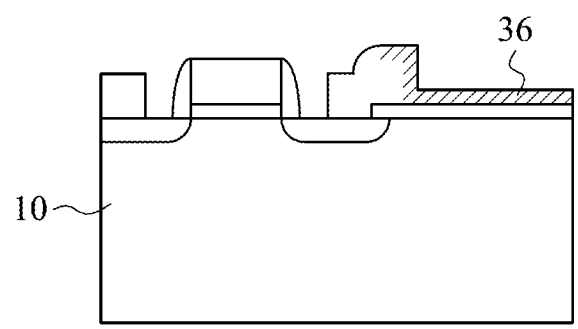
FIG. 8G shows a stage of a manufacturing process of a memory cell in accordance with the present disclosure.

Further, a thin portion 36 of the metal electrode is formed over the capacitance dielectric layer 40, as shown in FIG. 8G. The thin portion 36 can be formed by CVD, PVD, ALD and/or electro plating, followed by lithography and etching operations.

In some embodiments, the thin portion 36 is first formed and then the thick portion 34, the drain contact portion 32 and the source contact portion 35 are formed.

Figure 8H:
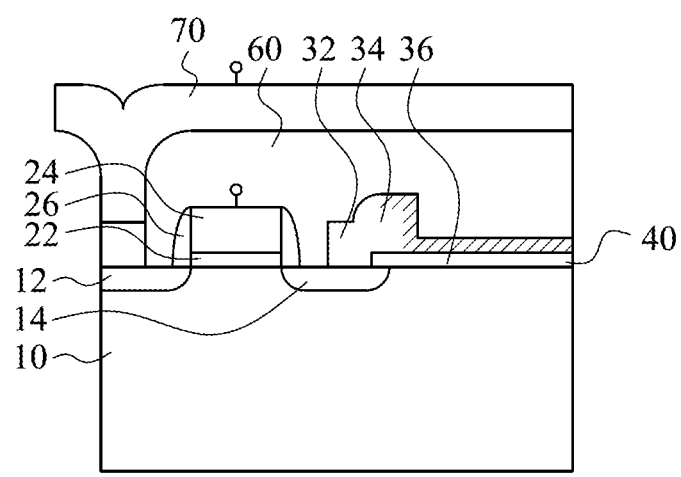
FIG. 8H shows a stage of a manufacturing process of a memory cell in accordance with the present disclosure.

Further, an interlayer dielectric (ILD) layer 60 is formed and then a bit line 70 made of a conductive material is formed as shown in FIG. 8H. The ILD layer 60 is deposited by a suitable technique, such as CVD. The ILD layer 60 includes one or more layers of a dielectric material, such as silicon oxide, silicon nitride, a low-k dielectric material or a combination thereof. The ILD layer 60 may be subsequently planarized by a CMP operation. The bit line 70 is made of a conductive material, such as Al, W, TiN, TaN, silicide (WSi, etc.) or any other suitable conductive materials.

Subsequently, further CMOS processes are performed to form various features such as additional interlayer dielectric layers, contacts/vias, interconnect metal layers, and passivation layers, etc.

FIGS. 9A-9I show various stages of a manufacturing process of the memory cell of FIG. 2A in accordance with the present disclosure. It is understood that additional operations can be provided before, during, and after processes shown by FIGS. 9A-9I, and some of the operations described below can be replaced or eliminated, for additional embodiments of the method. The order of the operations/processes may be interchangeable. Materials, configurations, processes and/or operations the same as or similar to those explained with respect to FIGS. 8A-8H may be applied to the following embodiments, and the detailed explanation thereof may be omitted to avoid redundancy.

Figure 9A:
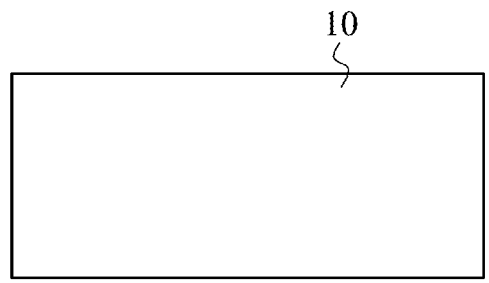
FIG. 9A shows a stage of a manufacturing process of a memory cell in accordance with the present disclosure.
Figure 9B:
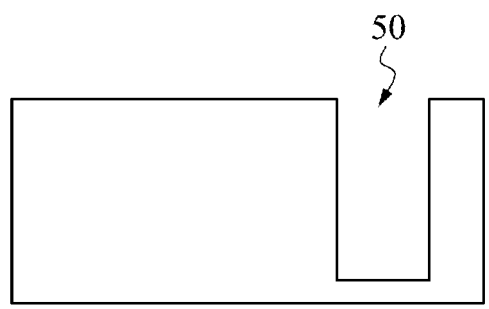
FIG. 9B shows a stage of a manufacturing process of a memory cell in accordance with the present disclosure.

In FIG. 9A, a substrate 10 is provided. Then, as shown in FIG. 9B, a trench 50 is formed in the substrate.

Figure 9C:
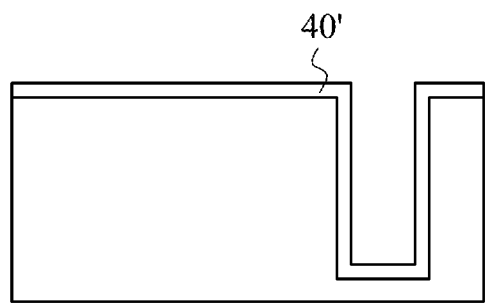
FIG. 9C shows a stage of a manufacturing process of a memory cell in accordance with the present disclosure.

Then, a capacitor dielectric layer 40' is formed as shown in FIG. 9C. Further, by using lithography and etching operations, unnecessary portions of the deposited layer are removed.

Figure 9D:
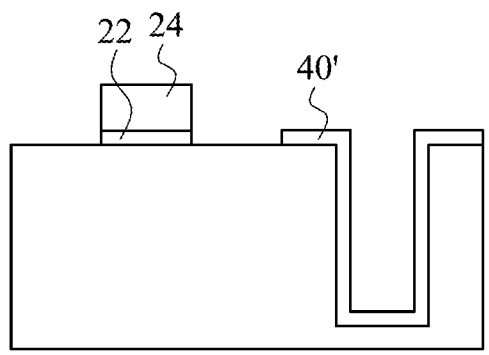
FIG. 9D shows a stage of a manufacturing process of a memory cell in accordance with the present disclosure.
Figure 9E:
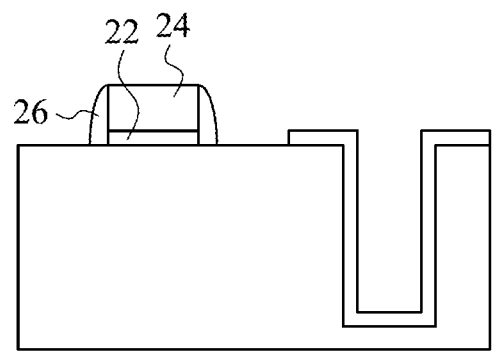
FIG. 9E shows a stage of a manufacturing process of a memory cell in accordance with the present disclosure.

Then, as shown in FIG. 9D, a gate dielectric layer 22 and a gate electrode layer 24 are formed. The gate dielectric layer 22 and the gate electrode layer 24 can be formed by a suitable film forming method, and by using lithography and etching operations, unnecessary portions of the deposited layers are removed. Further, as shown in FIG. 9E, sidewall spacers 26 are formed.

Figure 9F:
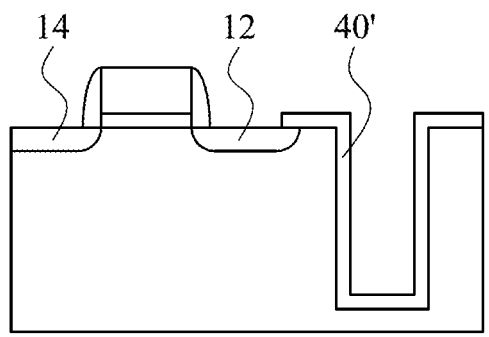
FIG. 9F shows a stage of a manufacturing process of a memory cell in accordance with the present disclosure.

Then, as shown in FIG. 9F, source 12 and drain 14 are formed by introducing impurities in both side regions of the gate structure in the substrate 10. The capacitor dielectric layer 40' may be formed after the source and drain are formed in some embodiments.

Figure 9G:
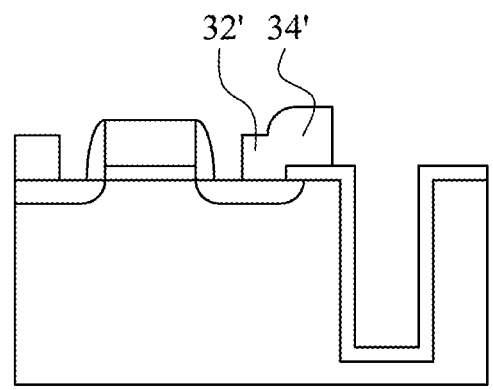
FIG. 9G shows a stage of a manufacturing process of a memory cell in accordance with the present disclosure.
Figure 9H:
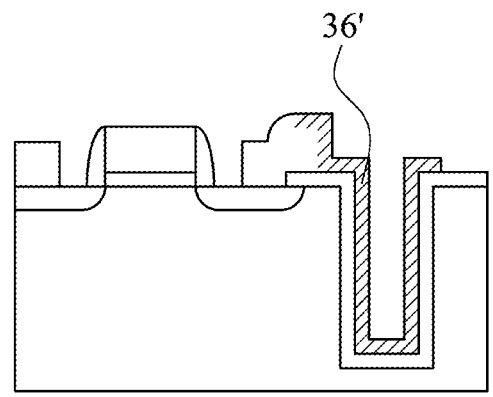
FIG. 9H shows a stage of a manufacturing process of a memory cell in accordance with the present disclosure.

Subsequently, conductive layers of a source contact portion 35 and a drain contact portion 32' and a thick portion 34' of the metal electrode (see, FIG. 2A) are formed, as shown in FIG. 9G. Further, a thin portion 36' of the metal electrode is formed over the capacitance dielectric layer 40' formed in the trench 50, as shown in FIG. 9H. The thin portion 36' can be deposited by CVD, PVD, ALD and/or electro plating, followed by lithography and etching operations.

In some embodiments, the thin portion 36' is first formed and then the thick portion 34', the drain contact portion 32' and the source contact portion 35 are formed.

Figure 9I:
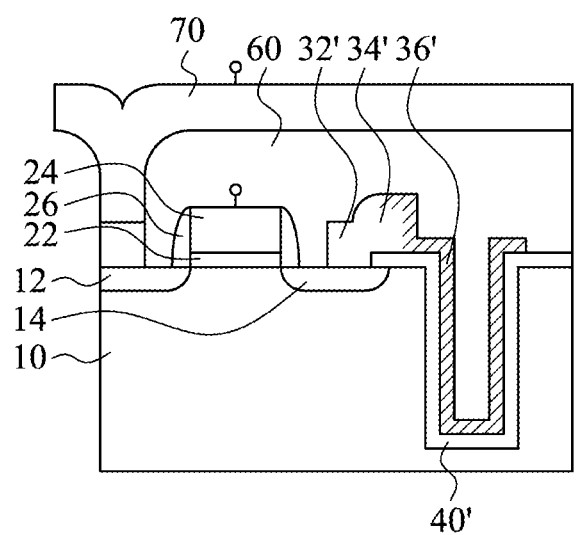
FIG. 9I shows a stage of a manufacturing process of a memory cell in accordance with the present disclosure.

Further, an interlayer dielectric (ILD) layer 60 is formed and then a bit line 70 made of a conductive material is formed as shown in FIG. 9I.

Subsequently, further CMOS processes are performed to form various features such as additional interlayer dielectric layers, contacts/vias, interconnect metal layers, and passivation layers, etc.

FIGS. 10A-10I show various stages of a manufacturing process of the memory cell of FIG. 3A in accordance with the present disclosure. It is understood that additional operations can be provided before, during, and after processes shown by FIGS. 10A-10I, and some of the operations described below can be replaced or eliminated, for additional embodiments of the method. The order of the operations/processes may be interchangeable. Materials, configurations, processes and/or operations the same as or similar to those explained with respect to FIGS. 8A-10I may be applied to the following embodiments, and the detailed explanation thereof may be omitted to avoid redundancy.

Figure 10A:
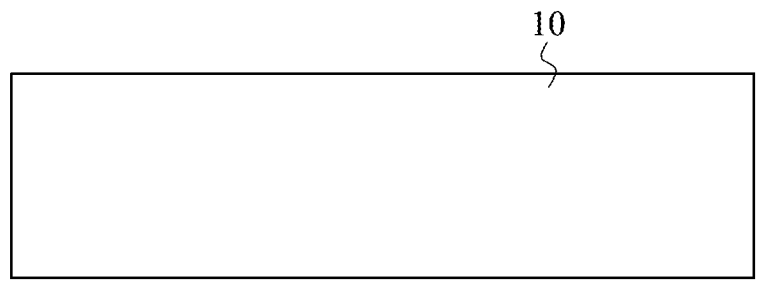
FIG. 10A shows a stage of a manufacturing process of a memory cell in accordance with the present disclosure.
Figure 10B:
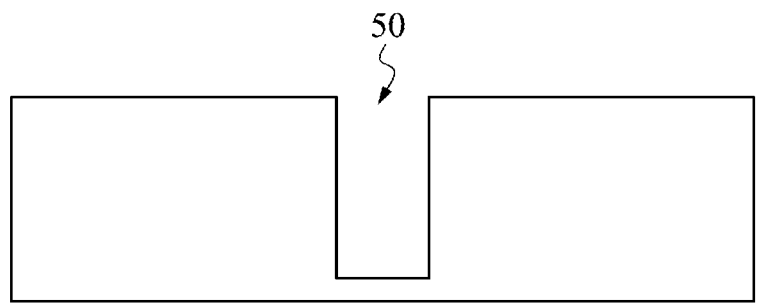
FIG. 10B shows a stage of a manufacturing process of a memory cell in accordance with the present disclosure.

In FIG. 10A, a substrate 10 is provided. Then, as shown in FIG. 10B, a trench 50 is formed in the substrate.

Figure 10C:
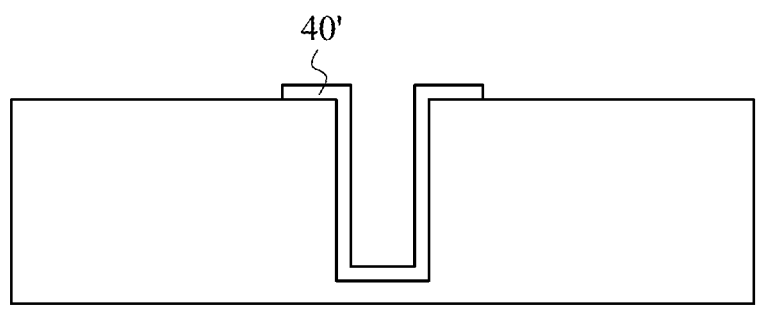
FIG. 10C shows a stage of a manufacturing process of a memory cell in accordance with the present disclosure.

Then, a capacitor dielectric layer 40' is formed as shown in FIG. 10C. Further, by using lithography and etching operations, unnecessary portions of the deposited layer are removed.

Figure 10D:
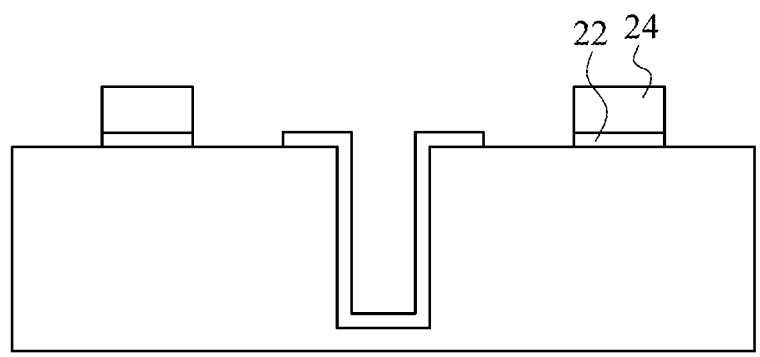
FIG. 10D shows a stage of a manufacturing process of a memory cell in accordance with the present disclosure.
Figure 10E:
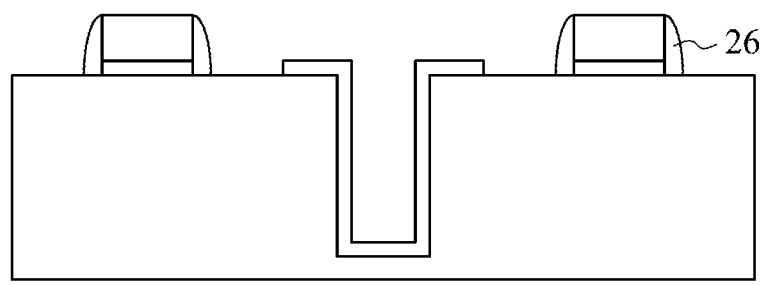
FIG. 10E shows a stage of a manufacturing process of a memory cell in accordance with the present disclosure.

Then, as shown in FIG. 10D, a gate dielectric layer 22 and a gate electrode layer 24 are formed. The gate dielectric layer 22 and the gate electrode layer 24 can be formed by a suitable film forming method, and by using lithography and etching operations, unnecessary portions of the deposited layers are removed. Further, as shown in FIG. 10E, sidewall spacers 26 are formed.

Figure 10F:
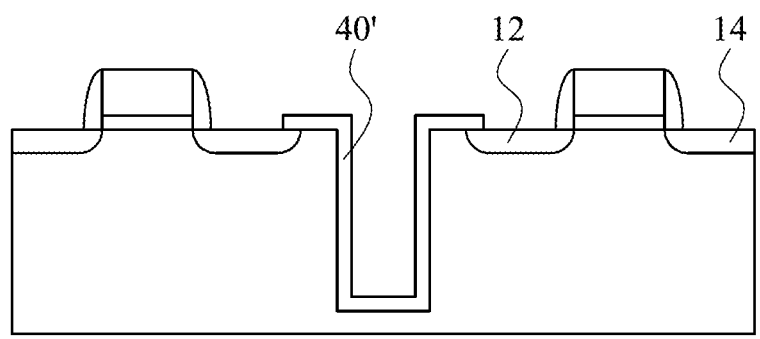
FIG. 10F shows a stage of a manufacturing process of a memory cell in accordance with the present disclosure.

Then, as shown in FIG. 10F, sources 12 and drains 14 are formed by introducing impurities in both side regions of the gate structures in the substrate 10. The capacitor dielectric layer 40' may be formed after the source and drain are formed.

Figure 10G:
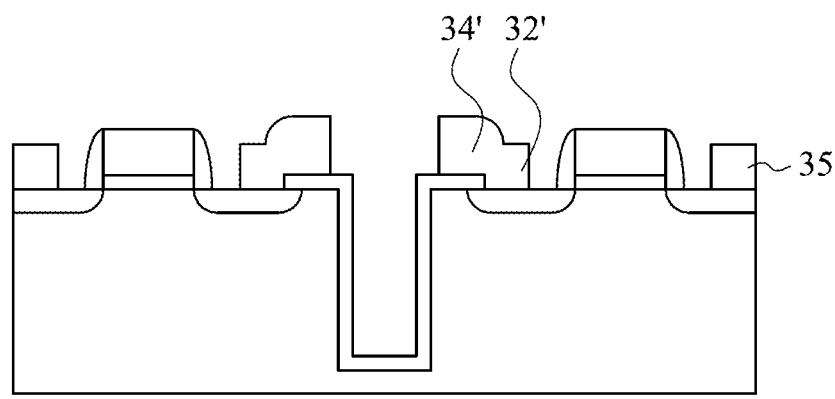
FIG. 10G shows a stage of a manufacturing process of a memory cell in accordance with the present disclosure.
Figure 10H:
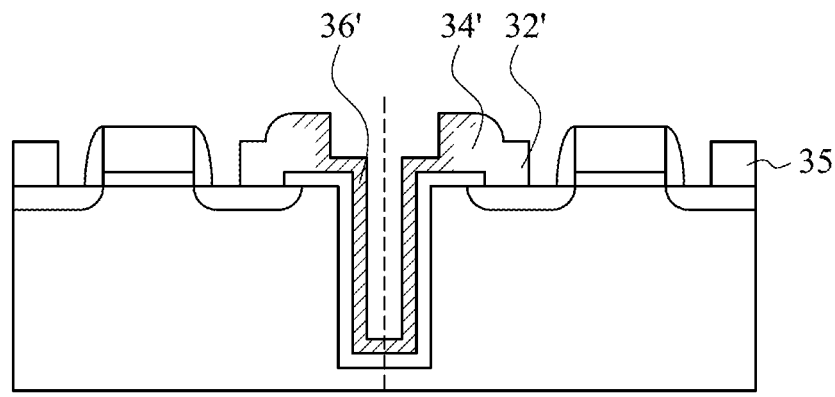
FIG. 10H shows a stage of a manufacturing process of a memory cell in accordance with the present disclosure.

Subsequently, conductive layers of a source contact portion 35 and a drain contact portion 32' and a thick portion 34' of the metal electrode 30' (see, FIG. 3A) are formed, as shown in FIG. 10G. Further, a thin portion 36' of the metal electrode 30' is formed over the capacitance dielectric layer 40' formed in the trench 50, as shown in FIG. 10H. The thin portion 36' can be formed by CVD, PVD, ALD and/or electro plating, followed by lithography and etching operations.

In some embodiments, the thin portion 36' is first formed and then the thick portion 34', the drain contact portion 32' and the source contact portion 35 are formed.

Figure 10I:
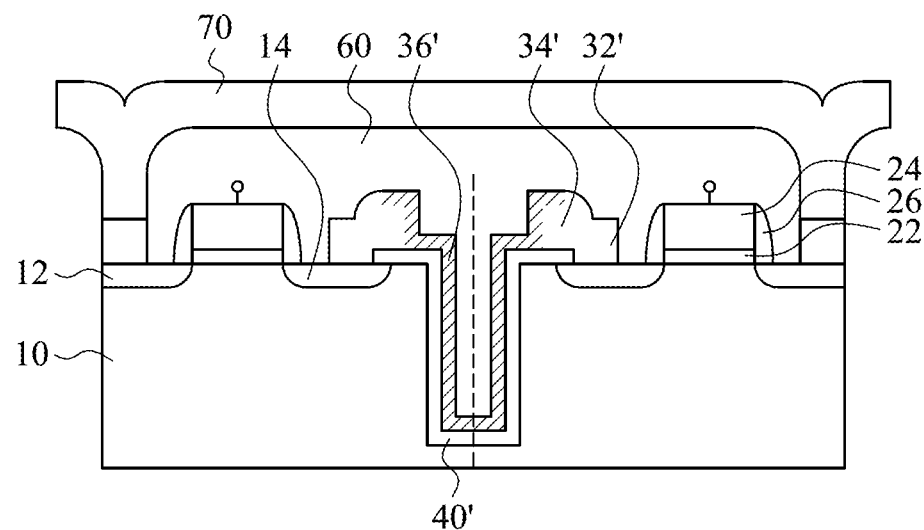
FIG. 10I shows a stage of a manufacturing process of a memory cell in accordance with the present disclosure.

Further, an interlayer dielectric (ILD) layer 60 is formed and then a bit line 70 made of a conductive material is formed as shown in FIG. 10I.

Subsequently, further CMOS processes are performed to form various features such as additional interlayer dielectric layers, contacts/vias, interconnect metal layers, and passivation layers, etc.

It will be understood that not all advantages have been necessarily discussed herein, no particular advantage is required for all embodiments or examples, and other embodiments or examples may offer different advantages.

For example, in the present disclosure, by employing a MIS structure with a metal electrode having a thin portion and a thick portion, a memory cell, which can be applied to a DRAM device, can be obtained. Further, it is possible to further scale down the DRAM device.

In accordance with an aspect of the present disclosure, a semiconductor memory device includes a transistor having a gate, a source and a drain and a metal-insulator-semiconductor (MIS) structure. The transistor and the MIS structure are disposed on a common substrate. The MIS structure includes a dielectric layer disposed on a semiconductor region, and an electrode disposed on the dielectric layer and coupled to the drain of the transistor. The electrode includes a bulk portion and a high-resistance portion, both disposed on the dielectric layer. The high-resistance portion has a resistance value in a range from $1.0 \times 10^{-4}$ to $1.0 \times 10^{4}$ $\Omega$cm or a sheet resistance in a range from $1.0 \times 10^{2}$ to $1.0 \times 10^{10}$ $\Omega/\square$. In one or more of the foregoing or following embodiments, the bulk portion and the high-resistance portion are made of a same conductive material, and a thickness of the high-resistance portion is smaller than a thickness of the bulk portion. In one or more of the foregoing or following embodiments, the thickness of the high-resistance portion is in a range from 1 nm to 10 nm. In one or more of the foregoing or following embodiments, a thickness of the dielectric layer is such a thickness that a tunnel current flows when a voltage is applied between the electrode and the semiconductor region. In one or more of the foregoing or following embodiments, the thickness of the dielectric layer is in a range from 0.5 nm to 5 nm. In one or more of the foregoing or following embodiments, an area of the high-resistance portion is in a range from 50% to 95% of an area of a capacitor in the MIS structure. In one or more of the foregoing or following embodiments, the bulk portion and the high-resistance portion are made of different material. In one or more of the foregoing or following embodiments, the high-resistance portion is made of doped or un-doped semiconductor material.

In accordance with another aspect of the present disclosure, a semiconductor device includes a first transistor having a gate, a source and a drain, and a metal-insulator-semiconductor (MIS) structure. The first transistor and the MIS structure are disposed on a common substrate. The MIS structure includes a trench formed in the substrate, a dielectric layer disposed in the trench, and an electrode disposed on the dielectric layer and coupled to the drain of the first transistor. The electrode includes a first bulk portion and a high-resistance portion, both disposed on the dielectric layer. The high-resistance portion has a resistance value in a range from $1.0 \times 10^{-4}$ to $1.0 \times 10^{4}$ $\Omega$cm or a sheet resistance in a range from $1.0 \times 10^{2}$ to $1.0 \times 10^{10}$ $\Omega/\square$. In one or more of the foregoing or following embodiments, the first bulk portion and the high-resistance portion are made of a same conductive material, and a thickness of the high-resistance portion is smaller than a thickness of the first bulk portion. In one or more of the foregoing or following embodiments, the thickness of the high-resistance portion is ½ to ¹⁄₁₀ of the thickness of the first bulk portion. In one or more of the foregoing or following embodiments, the thickness of the dielectric layer is in a range from 1 nm to 3 nm. In one or more of the foregoing or following embodiments, an area of the high-resistance portion is in a range from 50% to 95% of an area of a capacitor in the MIS structure. In one or more of the foregoing or following embodiments, the first bulk portion and the high-resistance portion are made of different material. In one or more of the foregoing or following embodiments, the high-resistance portion is made of doped or un-doped semiconductor material. In one or more of the foregoing or following embodiments, the high-resistance portion is disposed on the dielectric layer in the trench. In one or more of the foregoing or following embodiments, a part of the dielectric layer is disposed on the drain. In one or more of the foregoing or following embodiments, the semiconductor memory device further includes a second transistor having a gate, a source and a drain. The electrode of the MIS structure further includes a second bulk portion disposed on the dielectric layer and electrically coupled to the drain of the second transistor.

In accordance with another aspect of the present disclosure, a semiconductor dynamic random access memory includes a plurality of memory cells, a word line and a bit line. Each of the memory cells includes a transistor having a gate, a source and a drain, and a metal-insulator-semiconductor (MIS) structure. The MIS structure includes a dielectric layer disposed on a semiconductor region, and an electrode disposed on the dielectric layer and coupled to the drain of the transistor. The electrode includes a bulk portion and a high-resistance portion, both disposed on the dielectric layer. The high-resistance portion has a resistance value in a range from $1.0-10^{-4}$ to $1.0 \times 10^{4}$ $\Omega$cm or a sheet resistance in a range from $1.0 \times 10^{2}$ to $1.0 \times 10^{10}$ $\Omega/\square$. In one or more of the foregoing embodiments, the gate functions as the word line and the bit line is electrically coupled to the source.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory device comprising:
   a first transistor having a gate, a source and a drain; and
   a metal-insulator-semiconductor (MIS) structure, wherein:
   the first transistor and the MIS structure are disposed on a common substrate,
   the MIS structure includes a trench formed in the substrate;
   a dielectric layer disposed in the trench; and
   an electrode disposed on the dielectric layer and coupled to the drain of the first transistor,
   the electrode is made of a metal selected from the group consisting of Al, Cu, Ni, and Pt, the electrode includes a first bulk portion and a first portion, both disposed on the dielectric layer, the first portion has a higher resistance value or a higher sheet resistance than the bulk portion, and the first portion has a resistance value in a range from $1.0 \times 10^{-4}$ Ωcm to $1.0 \times 10^4$ Ωcm or a sheet resistance in a range from $1.0 \times 10^2$ Ω/□ to $1.0 \times 10^{10}$ Ω/□.

2. The semiconductor memory device according to claim 1, wherein a thickness of the first portion is greater than a thickness of the first bulk portion.

3. The semiconductor memory device according to claim 1, wherein a thickness of the first portion is equal to a thickness of the first bulk portion.

4. The semiconductor memory device according to claim 1, wherein a part of the first portion is disposed over the first bulk portion.

5. The semiconductor memory device according to claim 1, further includes a source contact portion made of a same material as the electrode.

6. The semiconductor memory device according to claim 1, wherein the electrode is made of Al.

7. A semiconductor dynamic random access memory comprising a plurality of memory cells, a word line and a bit line, wherein:

each of the plurality of memory cells includes:
a transistor having a gate structure, a source and a drain; and
a metal-insulator-semiconductor (MIS) structure,
the MIS structure includes:
a trench formed in a substrate;
a dielectric layer disposed in the trench; and
an electrode disposed on the dielectric layer and in direct contact with the drain of the transistor,
the electrode includes a bulk portion and a first portion, both disposed on the dielectric layer, and
the electrode does not fully fill the trench.

8. The semiconductor memory device according to claim 7, wherein a thickness of the first portion is greater than a thickness of the first bulk portion.

9. The semiconductor memory device according to claim 7, wherein a thickness of the first portion is equal to a thickness of the first bulk portion.

10. The semiconductor memory device according to claim 7, wherein the first portion is a non-doped or doped material selected from the group consisting of a polysilicon, an amorphous silicon, a poly germanium and an amorphous germanium.

11. The semiconductor memory device according to claim 7, wherein a portion of the first portion is disposed over the first bulk portion.

12. The semiconductor memory device according to claim 7, further includes a source contact portion made of a same material as the electrode.

13. The semiconductor memory device according to claim 7, wherein the first bulk portion and the first portion are made of different materials.

14. A semiconductor memory device comprising:
a first transistor having a gate structure, a source and a drain;
a second transistor having a gate structure, the source and a drain; and
first and second metal-insulator-semiconductor (MIS) structures, wherein:
the first and second transistors and the first and second MIS structures are disposed on a common substrate,
each of the first and second MIS structures includes:
a trench formed in the substrate;
a dielectric layer disposed in the trench; and
an electrode disposed on the dielectric layer and in direct contact with the drain of the transistor,
the electrode includes a bulk portion and a first portion, both disposed on the dielectric layer,
the first bulk portion and the first portion are made of different materials, and the electrode is made of a metal selected from the group consisting of Al, Cu, Ni, and Pt.

15. The semiconductor memory device according to claim 14, wherein a portion of the first portion is disposed over the first bulk portion.

16. The semiconductor memory device according to claim 14, further includes a source contact portion made of a same material as the electrode.

17. The semiconductor memory device according to claim 14, wherein a thickness of the first portion is equal to a thickness of the first bulk portion.

18. The semiconductor memory device according to claim 1, wherein the electrode is made of a metal selected from the group consisting of Ni and Pt.

19. The semiconductor memory device according to claim 14, wherein the electrode is made of a metal selected from the group consisting of Ni and Pt.

20. The semiconductor memory device according to claim 14, wherein a resistance value or a sheet resistance of the first portion is $10^2$ times to $10^6$ times that of the first bulk portion.

* * * * *